(12) United States Patent  (10) Patent No.: US 9,722,395 B2
Hamilton et al.  (45) Date of Patent: Aug. 1, 2017

(54) METHOD AND APPARATUS FOR MOUNTING A SEMICONDUCTOR DISK LASER (SDL)

(71) Applicant: SOLUS TECHNOLOGIES LIMITED, Glasgow Central Scotland (GB)

(72) Inventors: Craig James Hamilton, Glasgow Strathclyde (GB); Gareth Thomas Maker, Glasgow Strathclyde (GB)

(73) Assignee: SOLUS TECHNOLOGIES LIMITED, Glasgow (GB)

( * ) Notice: Subject to any disclaimer, the term of this patent is extended or adjusted under 35 U.S.C. 154(b) by 0 days.

(21) Appl. No.: 14/894,827

(22) PCT Filed: May 30, 2014

(86) PCT No.: PCT/GB2014/051654
§ 371 (c)(1),
(2) Date: Nov. 30, 2015

(87) PCT Pub. No.: WO2014/191758
PCT Pub. Date: Dec. 4, 2014

(65) Prior Publication Data
US 2016/0118771 A1  Apr. 28, 2016

(30) Foreign Application Priority Data
May 30, 2013 (GB) .................................. 1309713.4

(51) Int. Cl.
*H01S 3/04* (2006.01)
*H01S 5/024* (2006.01)
(Continued)

(52) U.S. Cl.
CPC ........ *H01S 5/02469* (2013.01); *H01S 3/0604* (2013.01); *H01S 5/02256* (2013.01);
(Continued)

(58) Field of Classification Search
CPC .............. H01S 5/02469; H01S 3/0604; H01S 5/02484; H01S 5/02476; H01S 5/02256
See application file for complete search history.

(56) References Cited

U.S. PATENT DOCUMENTS

2005/0180698 A1   8/2005   Hauffe et al.
2008/0019406 A1*  1/2008   Abram .................. B82Y 20/00
                                                     372/36
(Continued)

FOREIGN PATENT DOCUMENTS

EP   1 430 575 B1   11/2009
JP   59-151484 A     8/1984
(Continued)

OTHER PUBLICATIONS

Härkönen et al., "High power frequency doubled GaInNAs semiconductor disk laser emitting at 615 nm," Optics Express, Mar. 19, 2007, vol. 15 No. 6, XP55137410.

*Primary Examiner* — Yuanda Zhang
(74) *Attorney, Agent, or Firm* — Nixon & Vanderhye P.C.

(57) ABSTRACT

The present invention describes a method and apparatus for mounting a semiconductor disc laser (SDL). In particular there is described a cooling apparatus assembly (12) for mounting the semiconductor disc laser (1) the cooling apparatus assembly comprising a crystalline heat spreader (8) made of diamond, sapphire or SiC and optically contacted to the SDL (1). The apparatus further comprises a heatsink (13) made of copper and a recess (16) located on a first surface (15) of the heatsink. A pliable filler material (17) which may be In or an In alloy is provided within the recess (16) such that when a sealing plate (19) is fastened to the heatsink the SDL (1) is hermetically sealed within the recess. Hermetically sealing the SDL within the recess is found to significantly increase the lifetime of the device comprising the SDL. The heat sink (13) may be water cooled with pipes (Continued)

(14) delivering the water. In case the sealing plate (19) is made from for example Invar, it has an aperture (20).

15 Claims, 4 Drawing Sheets

(51) Int. Cl.
*H01S 3/06* (2006.01)
*H01S 3/23* (2006.01)
*H01S 5/022* (2006.01)
*H01S 5/183* (2006.01)

(52) U.S. Cl.
CPC ...... *H01S 5/02476* (2013.01); *H01S 5/02484* (2013.01); *H01S 3/2308* (2013.01); *H01S 5/0222* (2013.01); *H01S 5/02423* (2013.01); *H01S 5/183* (2013.01)

(56) References Cited

U.S. PATENT DOCUMENTS

| | | | |
|---|---|---|---|
| 2012/0257647 A1 | 10/2012 | Shu et al. | |
| 2013/0028279 A1* | 1/2013 | Iakovlev | H01S 5/02484 |
| | | | 372/36 |
| 2014/0159093 A1* | 6/2014 | Kraeuter | H01L 33/60 |
| | | | 257/98 |

FOREIGN PATENT DOCUMENTS

| WO | WO 2005/055381 A1 | 6/2005 |
|---|---|---|
| WO | WO 2011/091381 A2 | 7/2011 |

* cited by examiner

METHOD AND APPARATUS FOR MOUNTING A SEMICONDUCTOR DISK LASER (SDL)

This application is the U.S. national phase of International Application No. PCT/GB2014/051654 filed 30 May 2014, which designated the U.S. and claims priority to GB Patent Application No. 1309713.4 filed 30 May 2013, the entire contents of each of which are hereby incorporated by reference.

The present invention relates to the field of semiconductor lasers and in particular to a method and apparatus for mounting a semiconductor disc laser (SDL).

BACKGROUND TO THE INVENTION

It is noted that SDLs are also known in the art as Vertical External Cavity Emitting Lasers (VECSELs) or Optically Pumped Semiconductor Lasers (OPSLs). Therefore the term semiconductor disc laser (SDL) when used throughout the present description is used to refer to each of these systems.

The thermal sensitivity of semiconductor light-emitting devices is well known in the art, and it is also well known that devices tend to operate with greater efficiency at lower temperatures due to a decrease in carrier leakage with decreasing temperature. In an SDL structure, however, thermal effects are more complex. Optical pumping introduces a quantum defect between the pump and laser photons, producing excess heat in the gain structure which increases with increased pumping/SDL power, alongside the heating effects of non-radiative effects.

For most SDL applications, room temperature operation is desirable, indeed, the less temperature sensitive a structure is around room temperature, the better. Consequently, a great deal of skill and effort is taken within SDL systems in order to thermally manage the SDL structure.

Early techniques for thermally managing an SDL structure involved thermally mounting the SDL to a peltier controlled cooling block, as presented schematically in FIG. 1. In this arrangement the SDL 1 is bonded onto a copper mount 2 by a suitable layer of adhesive 3 e.g. conductive silver paint. The copper mount 2 is then attached to a copper block 4 by a layer of conductive heat paste 5. The temperature of the copper block 4 is then controlled by a peltier device 6 attached to a water-cooled copper heatsink 7.

When the SDL 1 shown in FIG. 1 is pumped, the heat generated must travel directly from its source within the SDL 1. The available routes for heat dissipation are primarily out through the front-surface of the SDL 1 into air, or back through the SDL 1 to the copper block 4 and eventually on to the water-cooled copper heatsink 7. The extremely low thermal conductivity ($\kappa$) of air ($\kappa$=0.026 $Wm^1K^{-1}$) results in a negligible amount of heat being evacuated via this route. Instead, the majority of the heat dissipates through the SDL 1 itself, which, due to its many-layer structure, and the inclusion of some low thermal conductivity layers e.g. those comprising AlGaAs ($\kappa$=22.5 $Wm^1K^{-1}$) and GaAs ($\kappa$=55 $Wm^1K^{-1}$), has a relatively high thermal impedance. It is therefore found that such a thermal management arrangement does not permit for high power lasing to be achieved.

Alternative techniques for thermally managing an SDL 1 structure are those based on crystalline heat spreaders, an example of which is schematically presented in FIG. 2. In particular, the cooling apparatus can be seen to comprise a heat spreader 8 and a standard thermoelectric or water cooler 9. The heat spreader 8 commonly employed in the art comprises a variety of materials including sapphire ($\kappa$=44 $Wm^1K^{-1}$), silicon carbide ($\kappa$=490 $Wm^1K^{-1}$) and diamond ($\kappa$=2000 $Wm^1K^{-1}$). The heat spreader 8 may further comprises an external, wedged face 10 with a high performance anti-reflection coating deposited thereon.

In these arrangements the heat spreader 8 is bonded by optical contacting with the SDL 1, sometimes referred to as "Van der Waals bonding". Direct or Van der Waals bonding techniques are commonly employed within the field of semiconductor lasers as a method for joining a heat spreader 8 to an SDL 1 without the need to employ an adhesive and so avoids the associated disadvantages associated with such adhesive layers e.g. mismatches in thermal expansion coefficients that may result in cracking at high temperatures, etalon effects in the adhesion layer, impurities in the adhesive that lead to optical losses and absorption, diffusion of foreign atoms into the SDL 1 and heat-spreader structures from the adhesive, structural weaknesses in the adhesive layer itself, and thermal impedance introduced by the layer and the additional interfaces. In summary, this technique involves the polishing and cleaning of the surfaces to be bonded. A bonding liquid e.g. water, methanol or acetone is then applied to one of the surfaces to be bonded. The second surface is then brought in to contact with the first, sandwiching the bonding liquid in between. The second surface is then gently moved across the first surface until a bond is felt to form, and the sample "snatches" to the first surface.

The SDL 1 and heat spreader 8 assembly is then typically fixed on top of a layer of indium foil 11 onto the thermoelectric or water cooler 9.

The described arrangement shown in FIG. 2 allows the heat spreader 8 to immediately spread the heat generated within the SDL 1 by a pump field to the cooling apparatus 9 after it has propagated only a limited distance into the SDL 1. As a result the overall efficiency of the SDL 1 is significantly increased when compared to the previously described thermal management configurations of FIG. 1. However, thermal management techniques that incorporate optical contacting between the heat spreader 8 and the SDL 1 are found to deteriorate over time due to the effects of evaporation on the bonding liquid and the ingress of foreign bodies between the bonded layers and onto the gain medium. These effects can have a direct impact on the performance of the SDL 1 and thus are found to significantly reduce the lifetime of any SDL 1 based device.

It is therefore an object of an embodiment of the present invention to obviate or at least mitigate the foregoing disadvantages of the methods and apparatus for mounting a semiconductor disc laser known in the art.

SUMMARY OF THE INVENTION

According to a first aspect of the present invention there is provided a cooling apparatus assembly for mounting a semiconductor disc laser (SDL) the cooling apparatus assembly comprising a crystalline heat spreader optically contacted to the SDL, a heatsink on a first surface thereof is located a recess, a pliable filler material located within the recess, and a sealing plate fastened to the heatsink so as to hermetically seal the SDL within the recess.

Hermetically sealing the SDL within the recess acts to significantly increase the lifetime of the device comprising the SDL. There are several reasons for this increased lifetime. In the first instance the effects of evaporation on the optical contact between the heat spreader and the SDL are significantly reduced. Secondly, the hermetic seal also acts to reduce the ingress of foreign bodies upon the gain medium of the SDL. The presence of the pliable filler material also provides mechanical support to the SDL while providing it with a good thermal contact with the heatsink.

Preferably the heatsink comprises copper.

The heat spreader may comprise a diamond, sapphire or silicon carbide material.

Most preferably the heatsink further comprises a cooling means e.g. an integrated flow return pipe or one or more peltier devices attached to one or more surfaces of the heatsink.

Preferably for the diameter of the crystalline heat spreader is greater than the diameter of the SDL. This arrangement acts to improve the thermal management provided by the cooling apparatus assembly.

Most preferably the pliable filler material comprises Indium or an Indium based alloy.

The heatsink may comprise one or more tapped holes located around the perimeter of the recess.

Most preferably the sealing plate comprises a central aperture.

It is preferable for a diameter of the central aperture that locates with the first surface to be smaller than the diameter of the crystalline heat spreader.

Preferably the central aperture is tapered.

The sealing plate may further comprise one or more apertures located around the perimeter of the central aperture.

According to a second aspect of the present invention there is provided a method of mounting a semiconductor disc laser (SDL) the method comprising
  optically contacting a head spreader to the SDL;
  providing a heatsink on a first surface thereof is located a recess;
  locating a pliable filler material within the recess;
  locating the SDL within the recess; and
  fastening a sealing plate to the heatsink so as to hermetically seal the SDL within the recess.

The heat spreader may comprise a diamond, sapphire or silicon carbide material.

Preferably the pliable filler material comprises Indium or an Indium based alloy.

The sealing plate may be fastened to the heatsink via one or more screws engaging with the first surface of the heatsink.

Embodiments of the second aspect of the invention may comprise features to implement the preferred or optional features of the first aspect of the invention or vice versa.

BRIEF DESCRIPTION OF THE DRAWINGS

There will now be described, by way of example only, various embodiments of the invention with reference to the drawings, of which.

Figure 1:
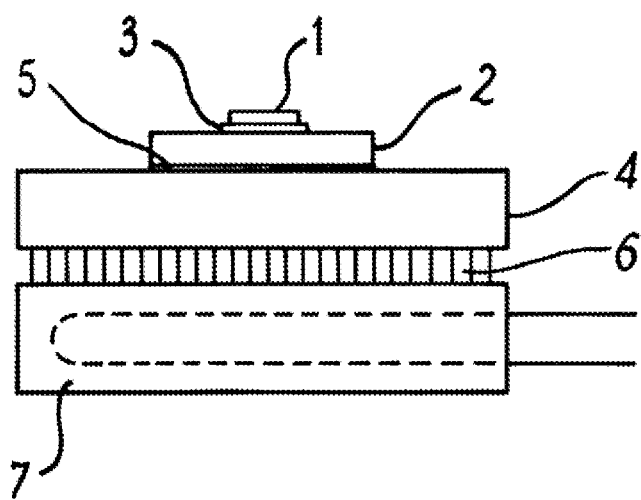
FIG. 1 presents a schematic representation of a semiconductor disk laser (SDL) mounted on a peltier controlled cooling block, as is known in the art.
Figure 2:
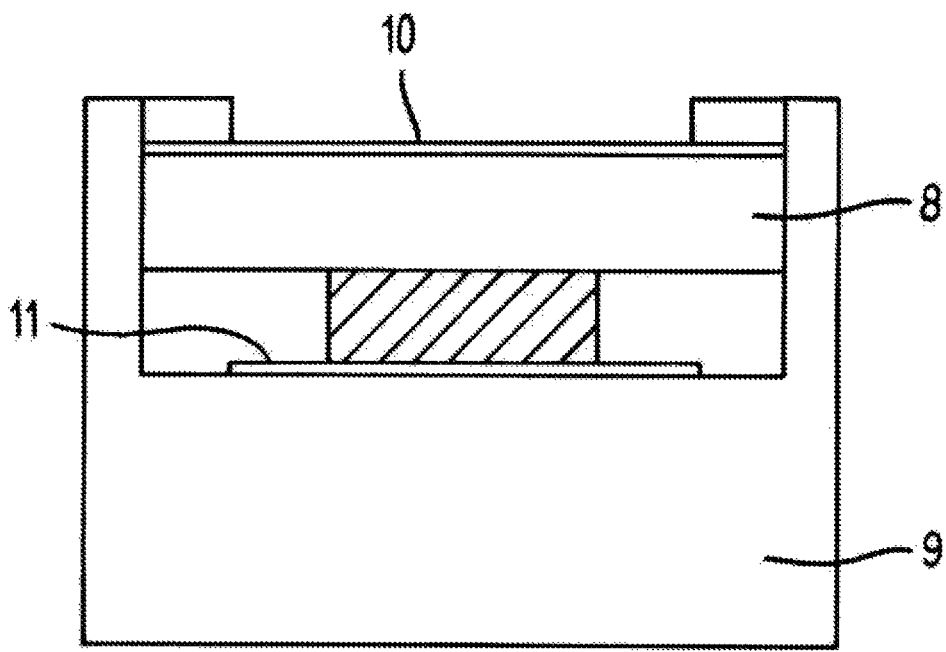
FIG. 2 presents a schematic representation of a semiconductor disk laser (SDL) that comprises a crystalline heat spreader, as is known in the art.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION OF PREFERRED EMBODIMENTS

Figure 3:
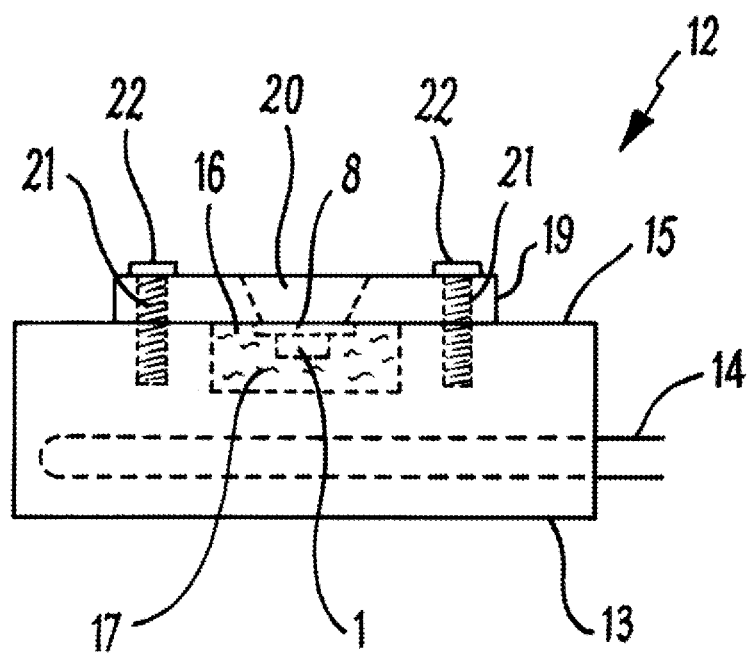
FIG. 3 present a schematic representation of a cooling apparatus employed in conjunction with an SDL in accordance with an embodiment of the present invention.
Figure 4A:
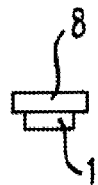
FIGS. 4(a)-(d) present a schematic representation of a method for mounting the SDL within the cooling apparatus of FIG. 3.
Figure 4B:
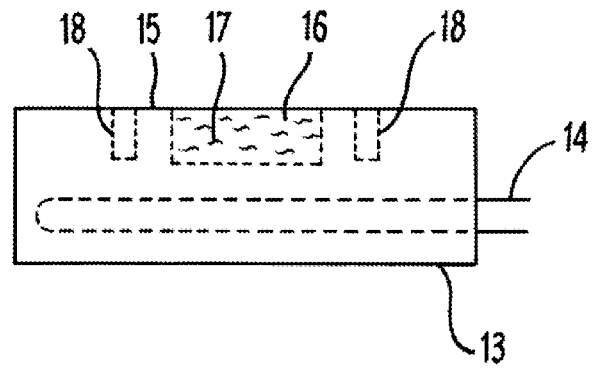
Figure 4C:
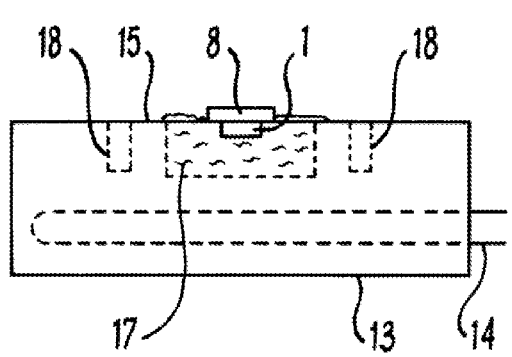
Figure 4D:
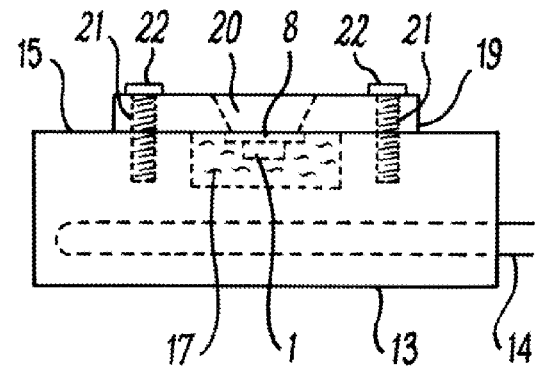

Details of the method and apparatus for mounting a semiconductor disc laser (SDL) 1 will now be described with reference to FIGS. 3 and 4. In particular, FIG. 3 present a schematic representation of a cooling apparatus assembly for mounting the SDL 1, as generally depicted by reference numeral 12. FIG. 4 presents a schematic representation of the corresponding method for mounting the SDL 1 within the cooling apparatus assembly 12.

The cooling apparatus assembly 12 can be seen to comprise a heatsink 13. It is preferable for the heatsink 13 to be made from copper given the relatively high thermal conductivity ($\kappa=401$ $Wm^1K^{-1}$) exhibited by this material, although other alternative materials may be employed. In the presently described embodiment the heatsink 13 comprises an integrated flow return pipe 14 that provides a means for a cooling liquid (e.g. water) to flow through the heatsink 13. It will be appreciated that other forms of cooling of the heatsink 13 may be employed e.g. by attaching one or more peltier devices to one or more surfaces of the heatsink 13 and thereafter separately cooling these one or more devices.

Located on a first surface 15 of the heatsink 13 is a recess 16. The recess 16 is sized so as to be capable of receiving an SDL 1 that has been optically contacted with a crystalline heat spreader 8. Typically the recess 16 has a diameter of around 10 mm.

In order to improve the thermal management provided by the cooling apparatus assembly 12 it is preferable for the diameter of the crystalline heat spreader 8 to be greater than that of the SDL 1.

The volume of the recess 16 not occupied by the SDL 1 or the crystalline heat spreader 8 is occupied by a filler material 17. The filler material 17 is required to exhibit good thermal conductivity ($\kappa$) so as to allow heat to flow efficiently from the heat spreader 8 to the heatsink 13. For reasons that will be explained in further detail below, the filler material 17 is also required to be mechanically pliable or malleable at standard room temperature (typically 20° C.). In order to satisfy these two criteria the filler material preferably comprises Indium exhibiting a thermal conductivity $\kappa=82$ $Wm^1K^{-1}$. It will however be appreciated that alternative materials to Indium could be employed to function as the filler material 17 e.g. an Indium based alloy.

Four tapped holes 18 are located around the perimeter of the recess 16. The tapped holes 18 are employed to provide a means for securing a sealing plate 19 to the first surface, as described in further detail below.

The sealing plate 19 can be seen to comprise a central aperture 20 around the perimeter of which are located four apertures 21, the apertures 21 being arranged so as to align with the tapped holes 18 of the heatsink 13 when the sealing plate 19 is located on, and fastened to, the first surface 15 by four screws 22. The diameter of the central aperture 20 that locates with the first surface is arranged to be smaller than the diameter of the crystalline heat spreader 8. Preferably this is achieved by employing a central aperture 20 that is tapered towards the heatsink 13. The central aperture 20 provides a means for a pump field to gain access to the SDL 1, via the crystalline heat spreader 8, and also for the generated output field to exit the cooling apparatus assembly 12. The preferred material for the sealing plate 19 is Invar®.

Invar®, also known generically as FeNi$_{36}$, is a nickel iron alloy notable in the art for its uniquely low coefficient of thermal expansion.

Advantageously, when the sealing plate 19 is fastened to the first surface 15 by the four screws 22 it acts to hermetically seal the SDL 1 within the recess 16. At this time the filler material 17 provides mechanical support to the SDL 1 while also providing it with a good thermal contact with the heatsink 13.

Method for Mounting an SDL

The method for mounting the SDL 1 will now be described with reference to FIG. 4.

In the first instance the heat spreader 8 is bonded by means of optical contacting with the SDL 1, as presented in FIG. 4(*a*).

Next a pliable filler material 17 is located within the recess 16 of the heatsink 13, as presented schematically in FIG. 4(*b*).

The penultimate step is presented in FIG. 4(*c*) whereby the heat spreader 8 and SDL 1 assembly is located within the recess 16. At this stage the SDL 1 is submerged within the filler material 17 while a portion of the heat spreader 8 generally remains protruding from the recess 16.

Finally, the sealing plate 19 is located upon, and fastened to, the first surface 15 of the heatsink 13 by threading the four screws 22 through the four apertures 21 and into the corresponding tapped holes 18. The pliable or malleable nature of the filler material 17 allows for the heat spreader 8 and SDL 1 assembly to be pushed down into the recess 16, without causing any damage to the SDL 1, until the previously exposed surface of the heat spreader 8 lies flush with the first surface 15. The resulting effect is that the SDL 1 is hermetically sealed within the recess 16. The pliable filler material 17 also provides mechanical support to the SDL 1 and provides it with a good thermal contact with the heatsink 13.

The above described method and apparatus for mounting an SDL 1 offer a number of advantages over those know in the prior art. In the first instance, the effects of evaporation on the optical contact between the heat spreader 8 and the SDL 1 are significantly reduced as a direct result of the presence of the hermetic seal. Hermetically sealing the SDL 1 within the recess 16 also significantly reduces the ingress of foreign bodies upon the gain medium of the SDL 1. The combined effects on the described cooling apparatus assembly 12 is that any SDL 1 based device which incorporates this apparatus and methodology experiences a significantly increased operating lifetime.

The present invention describes a method and apparatus for mounting a semiconductor disc laser (SDL). In particular there is described a cooling apparatus assembly for mounting the semiconductor disc laser (SDL) the cooling apparatus assembly comprising a crystalline heat spreader optically contacted to the SDL. The apparatus further comprises a heatsink and a recess located on a first surface of the heatsink. A filler material is provided within the recess such that when a sealing plate is fastened to the heatsink the SDL is hermetically sealed within the recess. Hermetically sealing the SDL within the recess is found to significantly increase the lifetime of the device comprising the SDL.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A cooling apparatus assembly for mounting a semiconductor disc laser (SDL), the cooling apparatus assembly comprising:
   a crystalline heat spreader optically contacted to the SDL;
   a heatsink comprising a recess located on a first surface thereof;
   the recess filled with a mechanically pliable filler material within which the SDL is submerged; and
   a sealing plate fastened to the heatsink to hermetically seal the SDL within the recess.

2. The cooling apparatus assembly as claimed in claim 1 wherein the heatsink comprises copper.

3. The cooling apparatus assembly as claimed in claim 1 wherein the heat spreader comprises a diamond, sapphire or silicon carbide material.

4. The cooling apparatus assembly as claimed in claim 1 wherein the heatsink further comprises a cooling means.

5. The cooling apparatus assembly as claimed in claim 1 wherein the diameter of the crystalline heat spreader is greater than the diameter of the SDL.

6. The cooling apparatus assembly as claimed in claim 1 wherein the filler material comprises Indium or an Iridium based alloy.

7. The cooling apparatus assembly as claimed in claim 1 wherein the heatsink comprises one or more tapped holes located around the perimeter of the recess.

8. The cooling apparatus assembly as claimed in claim 1 wherein the sealing plate comprises a central aperture.

9. The cooling apparatus assembly as claimed in claim 8 wherein a diameter of the central aperture that locates with the first surface is smaller than the diameter of the crystalline heat spreader.

10. The cooling apparatus assembly as claimed in claim 8 wherein the central aperture is tapered.

11. The cooling apparatus assembly as claimed in claim 8 wherein the sealing plate further comprise one or more apertures located around the perimeter of the central aperture.

12. A method of mounting a semiconductor disc laser (SDL), the method comprising;
   bonding by optical contacting a crystalline heat spreader to the SDL;
   providing a heatsink comprising a recess located on a first surface thereof;
   filling the recess with a mechanically pliable filler material;
   submerging the SDL within the mechanically pliable filler material; and
   pushing the crystalline heat spreader and the SDL further into the recess by fastening a sealing plate to the heatsink to hermetically seal the SDL within the recess.

13. The method of mounting a semiconductor disc laser as claimed in claim 12 wherein the heat spreader comprises a diamond, sapphire or silicon carbide material.

14. The method of mounting a semiconductor disc laser as claimed in claim 12 wherein the filler material comprises Indium or an Indium based alloy.

15. The method of mounting a semiconductor disc laser as claimed in claim 12 wherein the sealing plate is fastened to the heatsink via one or more screws engaging with the first surface of the heatsink.

* * * * *